(12) United States Patent
Joehren

(10) Patent No.: US 9,473,110 B2
(45) Date of Patent: Oct. 18, 2016

(54) ANTENNA RESONANCE FREQUENCY CONTROL USING AN ACTIVE RECTIFIER OR A DRIVER STAGE

(71) Applicant: NXP B.V., Eindhoven (NL)

(72) Inventor: Michael Joehren, San Jose, CA (US)

(73) Assignee: NXP B.V., Eindhoven (NL)

( * ) Notice: Subject to any disclaimer, the term of this patent is extended or adjusted under 35 U.S.C. 154(b) by 571 days.

(21) Appl. No.: 14/059,831

(22) Filed: Oct. 22, 2013

(65) Prior Publication Data
US 2015/0108848 A1    Apr. 23, 2015

(51) Int. Cl.
| | |
|---|---|
| H03J 5/24 | (2006.01) |
| H03J 3/20 | (2006.01) |
| H02J 17/00 | (2006.01) |
| H02J 7/02 | (2016.01) |

(52) U.S. Cl.
CPC ........... *H03J 5/244* (2013.01); *H02J 50/12* (2016.02); *H03J 3/20* (2013.01); *H02J 7/025* (2013.01); *H03J 2200/06* (2013.01)

(58) Field of Classification Search
CPC ........ H03J 5/244; H03J 3/20; H03J 2200/06; H02J 50/12; H02J 7/025
USPC ........................................................ 307/104
See application file for complete search history.

(56) References Cited

U.S. PATENT DOCUMENTS

| | | | | |
|---|---|---|---|---|
| 2013/0057200 A1* | 3/2013 | Potts | ................. | H02M 3/33584 320/107 |
| 2014/0300206 A1* | 10/2014 | Moes | ................. | H02M 7/5387 307/104 |

* cited by examiner

*Primary Examiner* — Jared Fureman
*Assistant Examiner* — Michael Warmflash

(57) ABSTRACT

An antenna control circuit including: an H-bridge circuit including three half-bridge circuits; and a controller configured to control the H-bridge circuit; wherein a first half-bridge circuit and a second half-bridge circuit of the three half-bridge circuits are configured to electrically connect across a resonant antenna with a first resonant frequency and a second resonant frequency; wherein a third half-bridge circuit is configured to electrically connect to a first capacitance connected to the resonant antenna, wherein the controller is configured to control the third half-bridge circuit to switch the connection of the first capacitance to the resonant antenna to a first position that changes the resonant frequency of the resonant antenna to the first resonant frequency.

16 Claims, 5 Drawing Sheets

ANTENNA RESONANCE FREQUENCY CONTROL USING AN ACTIVE RECTIFIER OR A DRIVER STAGE

TECHNICAL FIELD

Various exemplary embodiments disclosed herein relate generally to antenna frequency control.

BACKGROUND

Today's wireless charging and wireless power market is fragmented with different systems using various frequencies for the magnetic field energy transport including two different methodologies for coupling of the transmitter and receiver antennas. Magnetic inductive systems work similar to transformers requiring a close mechanical proximity and alignment of coils in a charger and a charged device. Magnetic inductive resonance systems allow for different antenna sizes and a larger distance between the charger and the charged device. Therefore, resonance systems performance may largely depend on the Q-factors of their respective antennas and the matching of their resonance frequencies.

SUMMARY

A brief summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various exemplary embodiments relate to an antenna control circuit including: an H-bridge circuit including three half-bridge circuits; and a controller configured to control the H-bridge circuit; wherein a first half-bridge circuit and a second half-bridge circuit of the three half-bridge circuits are configured to electrically connect across a resonant antenna with a first resonant frequency and a second resonant frequency; wherein a third half-bridge circuit is configured to electrically connect to a first capacitance connected to the resonant antenna, wherein the controller is configured to control the third half-bridge circuit to switch the connection of the first capacitance to the resonant antenna to a first position that changes the resonant frequency of the resonant antenna to the first resonant frequency.

Further, various exemplary embodiments relate to a multi-frequency antenna system including: a resonant antenna including a first port, second port, third port, an inductor coil, a first capacitor in parallel to the inductor coil between the first port and the second port, and a second capacitor connected between the first port and the third port; an H-bridge circuit including first, second, and third half-bridge circuits connected between an input/output and ground, wherein a first half-bridge circuit is connected to the first port, the second half-bridge circuit is connected to the second port, and the third half-bridge circuit is connected to the third port; and a controller configured to control the H-bridge circuit; wherein the controller is configured to control the first half-bridge and the second half-bridge so that the first and third ports are connected together so that the resonant antenna has a first resonant frequency; and wherein the controller is configured to control the second half-bridge and the third half-bridge so that the second and third ports are connected together so that the resonant antenna has a second resonant frequency.

Further, various exemplary embodiments relate to an method of tuning a multi-frequency resonant antenna including an inductor coil, a first capacitor, and a second capacitor including: providing a first control signal to a first half-bridge and a second half-bridge of a H-bridge circuit so that the first capacitor is in series with an input/output of the multi-frequency resonant antenna resulting in a first resonant frequency; and providing a second control signal to the second half-bridge and a third half-bridge of the H-bridge circuit so that the first capacitor is in parallel with the second capacitor resulting in a second resonant frequency.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. As used herein, the terms "context" and "context object" will be understood to be synonymous, unless otherwise indicated.

Figure 1:
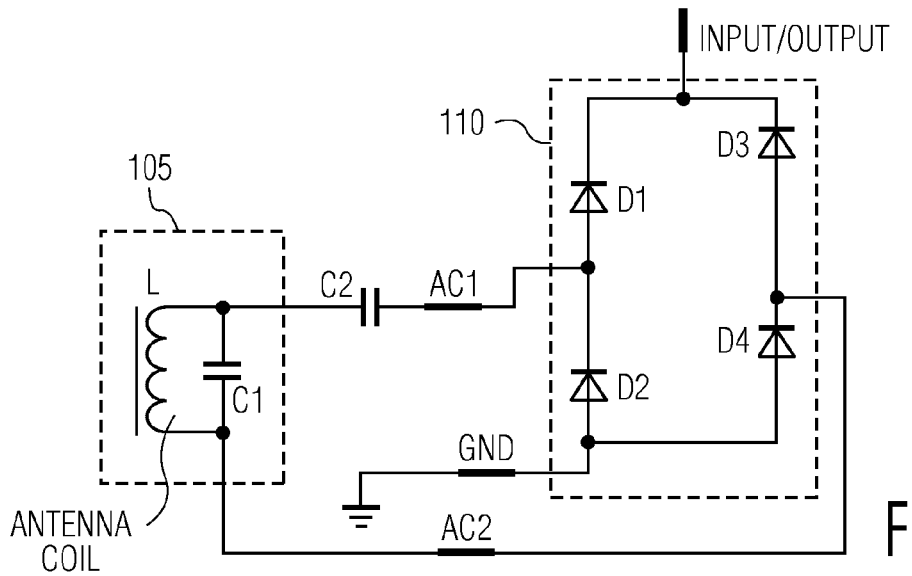
FIG. 1 illustrates a resonance antenna with a passive rectifier.

Two simple implementations of basic resonance power receiver systems are depicted below. FIG. 1 illustrates a resonance antenna 105 with a passive rectifier 110. The antenna resonator 105 includes coil L and capacitor C1 connected in parallel resulting in the resonance frequency of:

$$f_0 = \frac{1}{2\pi\sqrt{L \cdot C1}}.$$

Accordingly, the antenna resonator 105 is tuned to receive signals with a frequency of $f_0$. The passive rectifier 110 may include diodes D1, D2, D3, and D4 arranged in a typical rectifier layout. An input/output port may be connected between the diodes D1 and D3. The passive rectifier 110 may be connected to the antenna resonator 105 via ports AC1 and AC2. When a power signal with a frequency of $f_0$ impinges upon the antenna resonator 105, a rectified signal appears at the input/output port of the passive rectifier 110.

Figure 2:
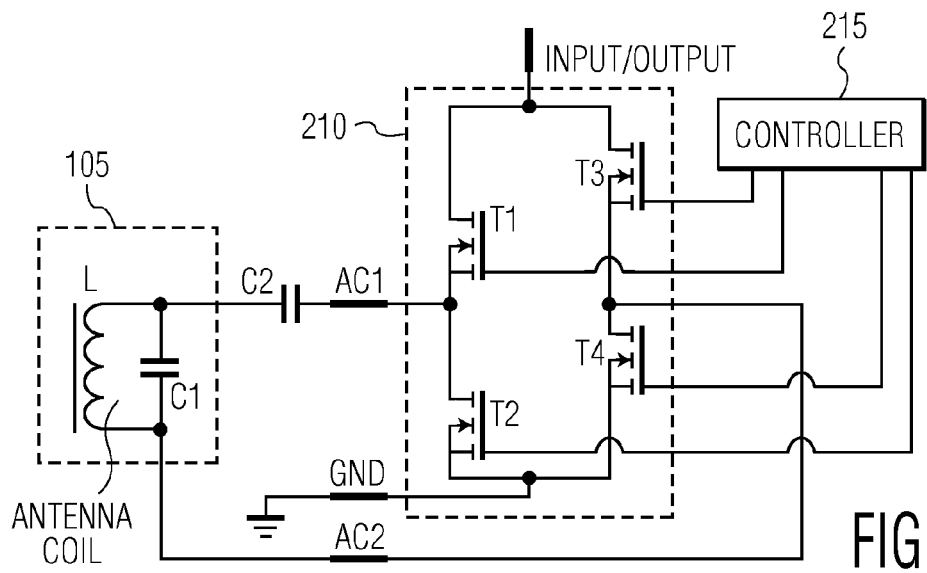
FIG. 2 illustrates a resonance antenna with an active rectifier.

FIG. 2 illustrates a resonance antenna 105 with an active rectifier 210. In the circuit of FIG. 2 the passive rectifier 110 of FIG. 1 is replaced with the active rectifier 210 and its controller 215. Otherwise, the circuit is the same. In the active rectifier 210 transistors T1, T2, T3, and T4 replace the diodes D1, D2, D3, and D4 of the passive rectifier 110. A controller 215 controls the on/off states of the transistors T1, T2, T3, and T4. For typical operation the transistors are in one of the following two states: T1, T4 ON and T2, T3 OFF; or T1, T4 OFF and T2, T3 ON. These two different states essentially reverse the polarity of the connection to the resonant antenna 105. The active resonator 210 may also be called an H-bridge. The H-bridge has two half-bridges. The first half-bridge includes transistors T1 and T2, and the second half-bridge includes the transistors T3 and T4.

Figure 3:
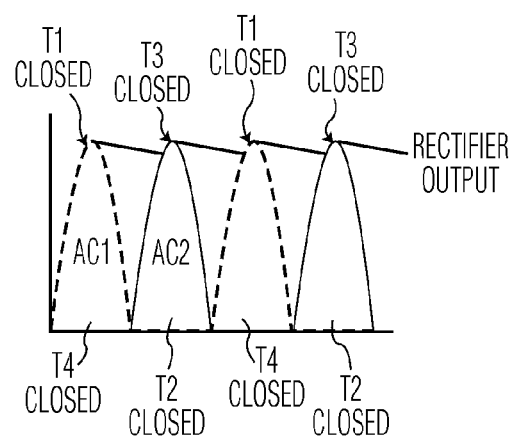
FIG. 3 illustrates the control of the rectifier and the resulting signals.

FIG. 3 illustrates the control of the rectifier and the resulting signals. For the conventional H-bridge based rectifier, the output voltage over time is shown in FIG. 3 assuming that the lower potential node, either AC1 or AC2, is first connected to ground GND. First T1 and T4 may be closed while T2 and T3 may be open connecting AC1 to the input/output port and AC2 to ground. Then, T2 and T3 may be closed while T1 and T4 are open connecting AC2 to the input/output port and AC1 to ground. The voltages at AC1 and AC2 are also shown as the transistors T1, T2, T3, and T4 are switched.

In another rectifier embodiment, the passive and active embodiments may also be mixed by replacing the bottom two diodes of the passive rectifier 110 with actively controlled transistors. The active rectifier 210 improves efficiency in system where the expected DC voltage is low and currents through the diodes/transistors are high.

In wireless power systems the maximum coil to coil efficiency may be obtained when the resonance frequencies of the antennas match. Therefore, if the resonant frequencies of the antennas do not match, then the power transfer efficiency is reduced. Power transfer efficiency is one of the crucial parameters of wireless power systems, and the power transfer efficiency depends on the accuracy of the resonance frequency. As different wireless power systems use different resonance frequencies for their energy transport (e.g., the Alliance for wireless power uses 6.78 MHz and NFC using 13.56 MHz), antenna system resonance frequencies have to be switched to use one antenna system for two different frequencies.

One way to vary the resonant frequency of the resonant antenna is to tap the coil or inductor in the resonant antenna at certain locations to result in different inductor values that would vary the value of the resonant frequency. The disadvantage of this approach is that the higher frequency system is only able to use a reduced effective antenna size as it is connected to a smaller portion of the total antenna size. Furthermore, tapper coils are more expensive to manufacture, and cost is another critical factor in today's consumer electronic market.

Figure 4:
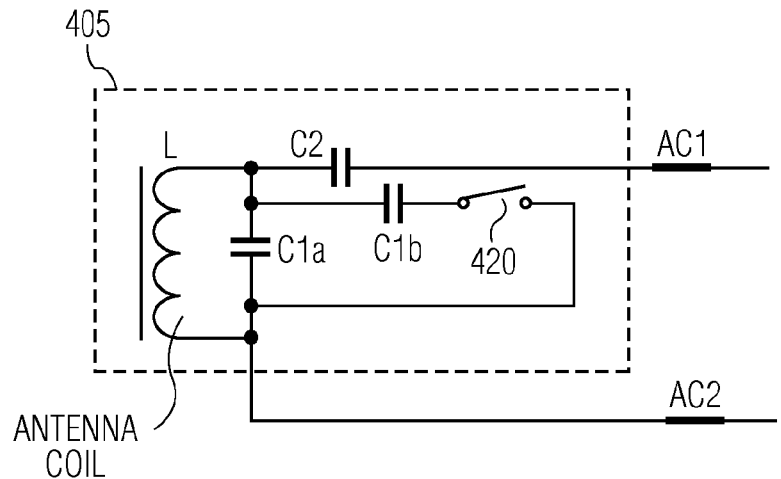
FIG. 4 illustrates a resonant antenna that is tunable to two different resonant frequencies.

FIG. 4 illustrates a resonant antenna that is tunable to two different resonant frequencies. The resonant antenna 405 is similar to resonant antenna 105 in FIG. 1, but adds a capacitor C1b that may be connected in parallel to capacitor C1a via a switch 420. This results in two different capacitances C1a and C1a+C1b being in parallel with the inductor L. This results in the two following resonant frequencies:

$$f_{0a} = \frac{1}{2\pi\sqrt{L \cdot C1a}}; \text{ and}$$

$$f_{0b} = \frac{1}{2\pi\sqrt{L \cdot (C1a + C1b)}}.$$

The problem with this approach is that in rectifier systems both inputs are considered to be AC inputs that swap polarities which each AC cycle. Typically a pass gate transistor is the load switch used to connect and disconnect capacitors. As the voltage across the resonance antenna 405 and the current to and from the tuning capacitors maybe substantial, the switch used must often be able to withstand voltages much higher than the rectifier AC inputs. For example, in high Q systems with a rectifier being in a high impedance situation, the voltage across the coil may reach>100V. In most large scale integration semiconductor technologies used for power management applications, such very high-voltage components are very expensive to add and would increase cost drastically. Besides, most mainstream technologies simply do not offer these voltage levels today. Furthermore, these switching transistors do not add any further benefits to the system. Hence, there remains a need for an improved variable frequency resonant antenna.

The embodiments described below provide a solution using the same physical antenna for different frequencies without using any taps or special switches to change the tuning capacitor value. Instead these embodiments are based on a sliced or distributed rectifier system. One embodiment uses, e.g., three half-bridges (one more than in the conventional system) to be able to operate with two different frequencies. If four half-bridges are used, four different frequency combinations are possible because $N_f = 2^{N_{br}-2}$, where $N_f$ is the number of possible frequencies and $N_{br}$ is the number of half-bridges.

Figure 5:
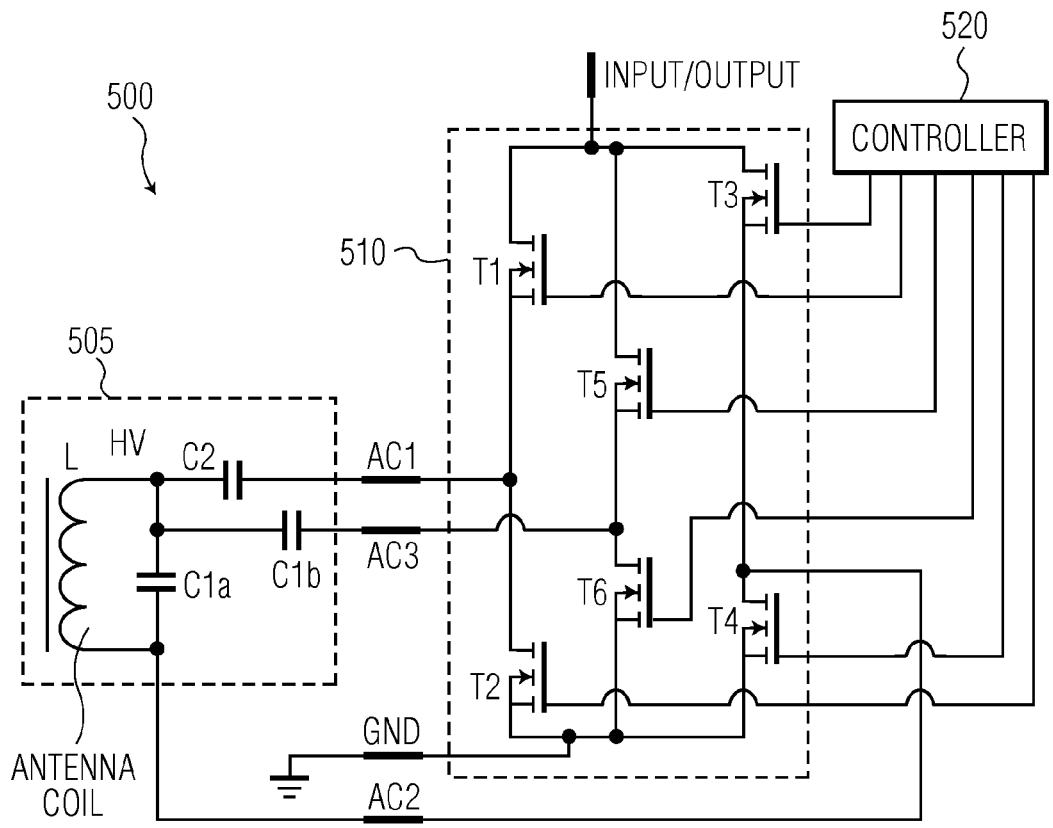
FIG. 5 illustrates an H-bridge controller for a dual frequency resonance antenna.

FIG. 5 illustrates an H-bridge controller for a dual frequency resonance antenna. The system 500 includes a resonator antenna 505, an H-bridge rectifier 510 and a controller 520. The resonance antenna 505 is like that described above in FIG. 4. The resonance antenna 505 includes an inductive coil L and two capacitors C1a and C1b that combine to implement the resonant antenna 505. The resonant antenna 505 may also include a coupling capacitor C2 to couple the resonant antenna to the H-bridge rectifier 510. While two capacitors C1a and C1b are illustrated, additional capacitors C1n may be added to be connected similar to capacitor C1b.

The H-bridge rectifier 510 may include three-half bridges including pairs of transistors: T1 and T2; T3 and T4; and T5 and T6. A first half-bridge including T1 and T2 is connected to port AC1 and then to the coupling capacitor C2 of the resonant antenna 505. A second half-bridge including T3 and T4 is connected to port AC2 and then to the coil inductor L and the capacitor C1a of the resonant antenna 505. A third half-bridge including T5 and T6 is connected to port AC3 and then to the coupling capacitor C1b of the resonant antenna 505.

The controller 520 is connected to the gates of each of the transistors T1, T2, T3, T4, T5, and T6 and provides a control signal to turn each of the transistors ON or OFF. Alternatively, instead of having one central controller, each transistor could also be controlled by individual control circuits communicating with each other. The operation of the system 500 will now be described.

Figure 6:
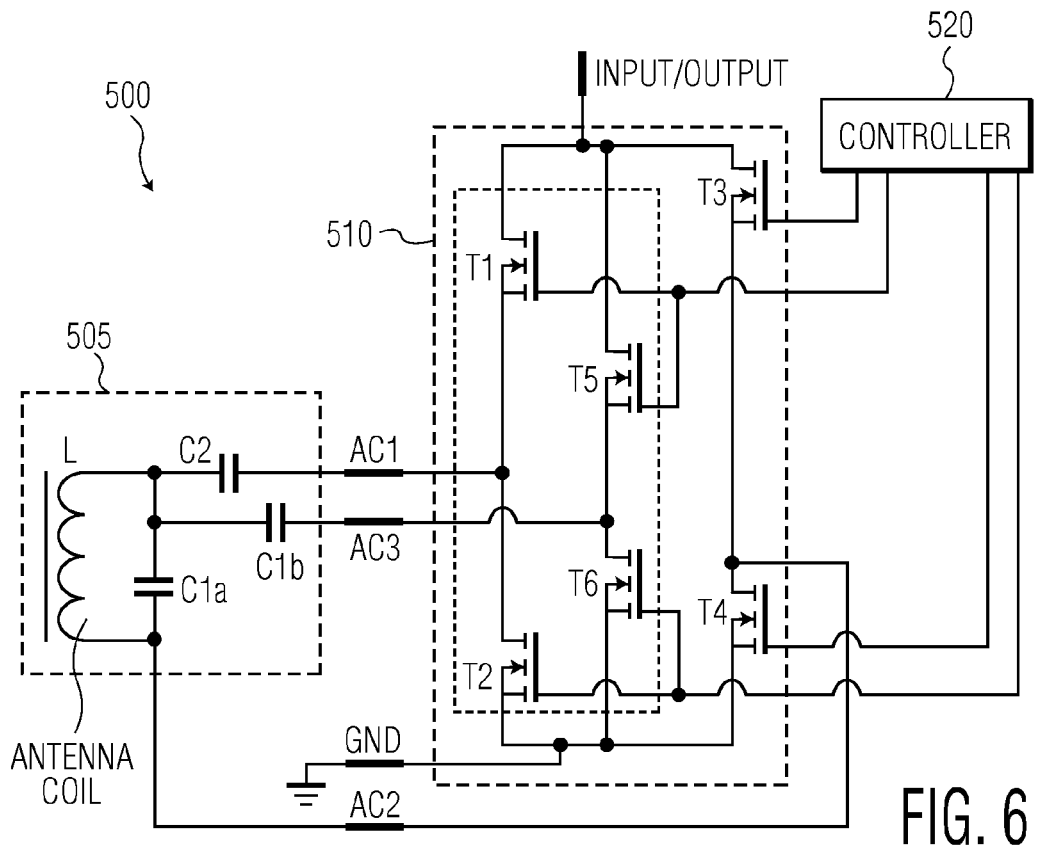
FIG. 6 illustrates a first frequency mode of the resonant antenna.

FIG. 6 illustrates a first frequency mode of the resonant antenna. The controller 520 in this mode provides the same control signal to transistors T1 and T5 and the same control signal to transistors T2 and T6. This results in the ports AC1 and AC3 having the same voltage. This results in the capacitor C1b being in parallel to C2. This results in the coupling capacitance changing, but the values of C2 and C1b may be selected such that the change in coupling capacitance does not affect the operation of the resonant antenna 505. In this mode the resonant antenna is tuned to a frequency $f_{0a}$ as described above.

Figure 7:
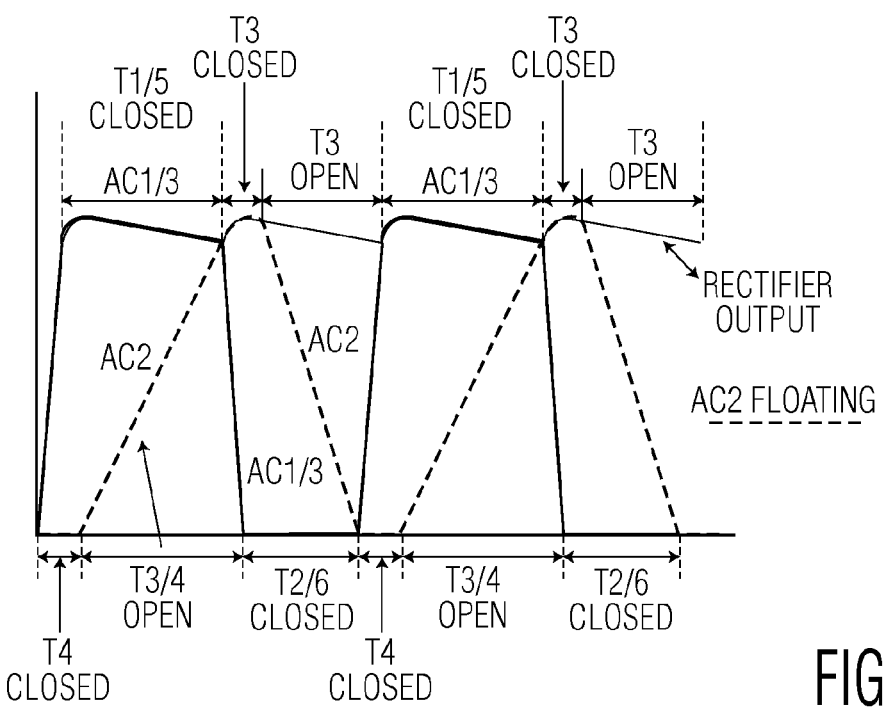
FIG. 7 illustrates the control of the rectifier and the resulting signals based upon a possible switching methodology over time for operation in the first frequency mode.

FIG. 7 illustrates the control of the rectifier and the resulting signals based upon a possible switching methodology over time for operation in the first frequency mode. The controller 515 may first close transistor T4. This connects port AC2 to ground GND. Next. The controller may close T1 and T5. This connects the input/output to one terminal of the resonant antenna 505 via ports AC1 and AC3 and results in the voltage at AC1 and AC3 to increase as shown in the plot. Next, the controller may open transistor T3 along with transistor T4. This may allow the voltage at AC2 to float as shown. Next, transistor T3 may be closed to thereby connect the port AC2 of the resonant antenna 505 to the input/output. Shortly thereafter, the controller may close transistors T2 and T6 along with opening transistors T1 and T5. This switches the connections of port AC1 and AC3 from the input/output to ground GND. This results in the voltage at AC1 and AC3 returning to zero as shown in the plot. Then as shown the controller 515 may open transistor T3 which allows the voltage at AC2 to float. Then the control cycle may start over with the controller 515 closing transistor T4 and proceeding again as described above and as shown in the plot in FIG. 7.

Note that in the first frequency mode of operation AC1 and AC3 are never floating and the change from transistors T1 and T5 to T2 and T6 being conducting should happen during the AC1/AC3 to AC2 voltage level cross over. Depending on the required impedance of the antenna resonator 505 to the H-bridge rectifier 510, the transistors T1 and T2 or T5 and T6 may be operated in a high impedance mode to reduce the impact of C1b on the impedance.

Figure 8:
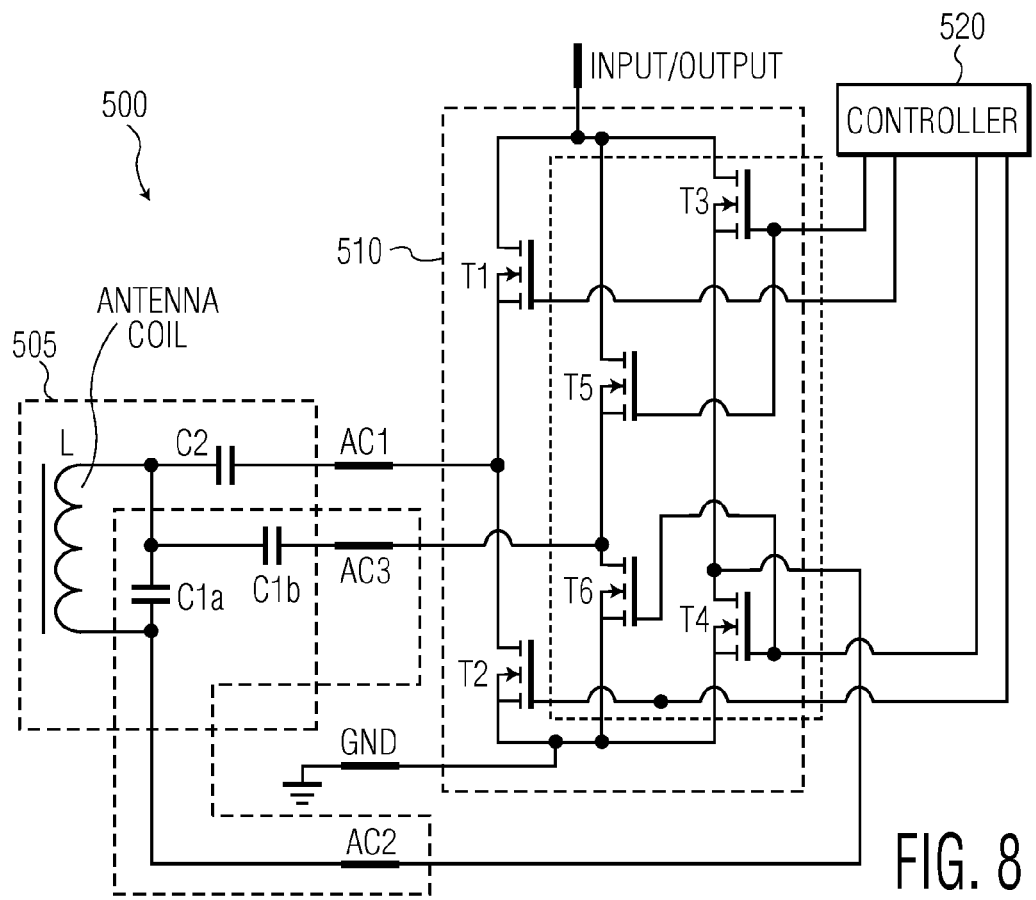
FIG. 8 illustrates a second frequency mode of the resonant antenna.

FIG. 8 illustrates a second frequency mode of the resonant antenna. The controller 520 in this mode provides the same control signal to transistors T3 and T5 and the same control signal to transistors T4 and T6. This results in the ports AC2 and AC3 having the same voltage. This results in the capacitor C1b being in parallel to C1a. This results in the resonance capacitance changing to C1a+C1b. In this mode the resonant antenna is tuned to a frequency $f_{0b}$ as described above.

Figure 9:
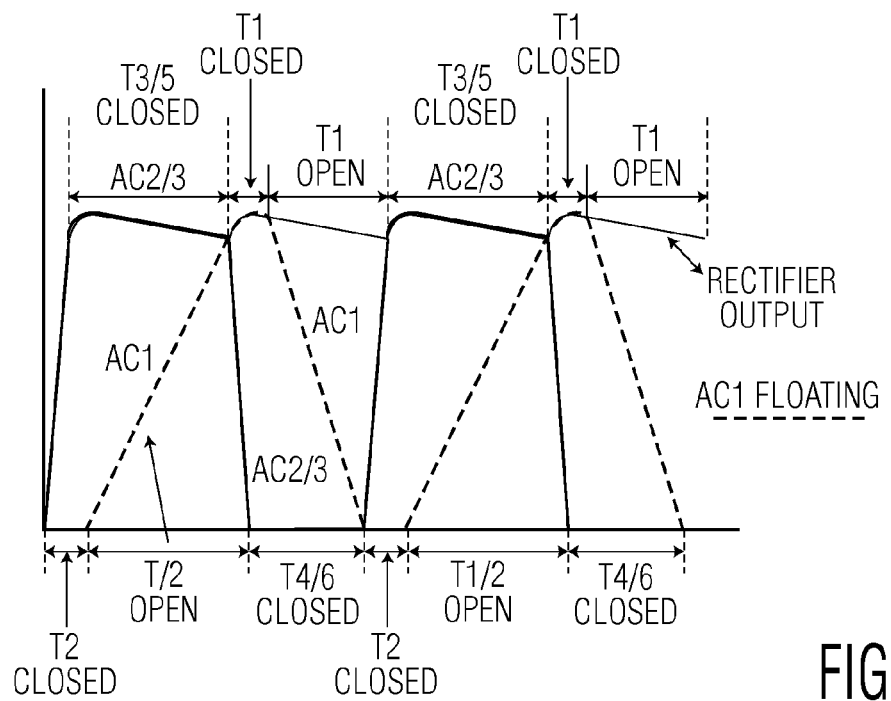
FIG. 9 illustrates the control of the rectifier and the resulting signals based upon a possible switching methodology over time for operation in the first frequency mode.

FIG. 9 illustrates the control of the rectifier and the resulting signals based upon a possible switching methodology over time for operation in the first frequency mode. The controller 515 may first close transistor T2. This connects port AC1 to ground GND. Next. The controller may close T3 and T5. This connects the input/output to one terminal of the resonant antenna 505 via ports AC2 and AC3 and results in the voltage at AC2 and AC3 to increase as shown in the plot. Next, the controller may open transistor T2 along with transistor T1. This may allow the voltage at AC1 to float as shown. Next, transistor T1 may be closed to thereby connect the port AC1 of the resonant antenna 505 to the input/output. Shortly thereafter, the controller may close transistors T4 and T6 along with opening transistors T3 and T5. This switches the connections of port AC2 and AC3 from the input/output to ground GND. This results in the voltage at AC2 and AC3 returning to zero as shown in the plot. Then as shown the controller 515 may open transistor T1 which allows the voltage at AC1 to float. Then the control cycle may start over with the controller 515 closing transistor T2 and proceeding again as described above and as shown in the plot in FIG. 9.

Figure 10:
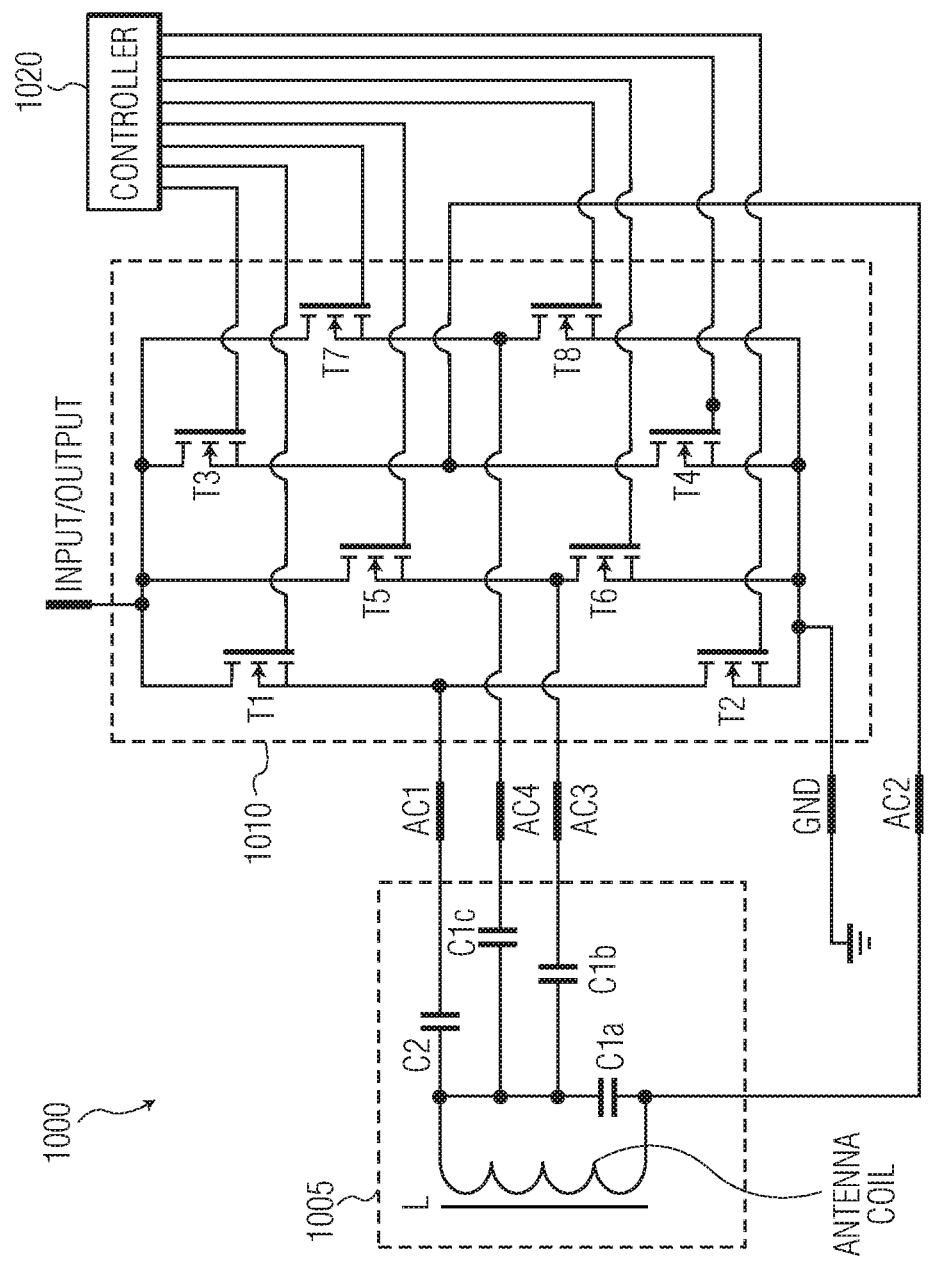

As mentioned above the H-bridge rectifier 510 may be expanded to include additional half-bridges connected to additional capacitors C1n. Such additional capacitors may be connected in parallel in various combinations to produce multiple different resonance frequencies. FIG. 10 illustrates an H-bridge controller with four half-bridges. The system 1000 is similar to the system 500 in FIG. 5. Comparing to the system 500 in FIG. 5, the system 1000 includes an additional half-bridge including two transistors T7 and T8, an additional port AC4 connected to the half-bridge, and an additional capacitor C1c. The system 1000 includes a resonator antenna 1005, an H-bridge rectifier 1010 and a controller 1020. The resonance antenna 1005 includes an inductive coil L and three capacitors C1a, C1b, and C1c that combine to implement the resonant antenna 1005. The resonant antenna 1005 may also include a coupling capacitor C2 to couple the resonant antenna to the H-bridge rectifier 1010. The H-bridge rectifier 1010 may include four half-bridges including pairs of transistors: T1 and T2; T3 and T4; T5 and T6; and T7 and T8. A first half-bridge including T1 and T2 is connected to port AC1 and then to the coupling capacitor C2 of the resonant antenna 1005. A second half-bridge including T3 and T4 is connected to port AC2 and then to the coil inductor L and the capacitor C1a of the resonant antenna 1005. A third half-bridge including T5 and T6 is connected to port AC3 and then to the coupling capacitor C1b of the resonant antenna 1005. A fourth half-bridge including T7 and T8 is connected to port AC4 and then to the coupling capacitor C1c of the resonant antenna 1005. The controller 1020 is connected to the gates of each of the transistors T1, T2, T3, T4, T5, T6, T7, and T8 and provides a control signal to turn each of the transistors ON or OFF. Alternatively, instead of having one central controller, each transistor could also be controlled by individual control circuits communicating with each other.

In another embodiment, the H-bridge rectifier may include half active rectifiers in which only the bottom (or top) diodes are replaced by transistor (also often referred to as active diodes). This embodiment would be controlled as described above.

The embodiments described above provide various advantages. Even though the node connecting L, C1a, C1b and C2 may still reach very high voltages, the rectifier circuit is no longer exposed to this voltage but can be kept within its typical allowed operating voltage range. The voltage across the transistors may be limited by the intrinsic body diodes or an active control scheme to keep the transistor conducting when the AC-input voltages exceed the minimum or maximum supply voltage limits. Furthermore, the rectifier transistor size may be selected such that the half-bridge combination of the higher power system is balanced, while the lower-power system will lose only a small amount of efficiency. Accordingly, all transistors contribute to the power efficiency of the system and do not require any upgrades in electrical performance compared to the conventional single frequency system implementation.

The embodiments described above have been described in the context of wireless power systems. The embodiments may also be applied in any multi-frequency system where high voltages may be found in the resonant antenna and an H-bridge rectifier is used.

It should be appreciated by those skilled in the art that any block diagrams herein represent conceptual views of illustrative circuitry embodying the principles of the invention. Further, in the circuits shown additional elements may also be included as needed, or variations to the structure of the circuit may be made to achieve the same functional results as the circuits illustrated.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:

1. An antenna control circuit comprising:
   an H-bridge circuit including three half-bridge circuits; and
   a controller configured to control the H-bridge circuit;
   wherein a first half-bridge circuit and a second half-bridge circuit of the three half-bridge circuits are configured to electrically connect across a resonant antenna with a first resonant frequency and a second resonant frequency;
   wherein a third half-bridge circuit is configured to electrically connect to a first capacitance connected to the resonant antenna, wherein the controller is configured to control the third half-bridge circuit to switch the connection of the first capacitance to the resonant antenna to a first position that changes the resonant frequency of the resonant antenna to the first resonant frequency;
   wherein the resonant antenna comprises a second capacitance and an inductor coil, wherein the second capacitance is in parallel with the inductor coil.

2. The circuit of claim 1, wherein the controller is configured to control the third half-bridge circuit to switch the connection of the first capacitance to a second position that changes the resonant frequency of the resonant antenna to the second resonant frequency.

3. The circuit of claim 1, wherein the first half-bridge includes transistors T1 and T2, the second half-bridge includes transistors T3 and T4, and the third half-bridge include transistors T5 and T6, and wherein the controller includes a plurality of control circuits, wherein each of the plurality of control circuits is configured to control one of the transistors T1, T2, T3, T4, T5, and T6.

4. The circuit of claim 1, wherein,
   the first half-bridge includes transistors T1 and T2 and the third half-bridge include transistors T5 and T6, and
   the controller controls transistors T1 and T5 together and the controller controls transistors T2 and T6 together so that the resonant frequency of the resonant antenna is the first resonant frequency.

5. The circuit of claim 1, wherein,
   the second half-bridge includes transistors T3 and T4 and the third half-bridge include transistors T5 and T6, and
   the controller controls transistors T3 and T5 together and the controller controls transistors T4 and T6 together so that the resonant frequency of the resonant antenna is the second resonant frequency.

6. The circuit of claim 1, wherein
   the H-bridge circuit includes a fourth half-bridge circuit, wherein the fourth half-bridge circuit is configured to electrically connect to a third capacitance connected to the resonant antenna, wherein the controller is configured to control the fourth half-bridge circuit to switch the connection of the third capacitance to the resonant antenna in combination with the first capacitance to allow for four different resonant frequencies for the resonant antenna.

7. A multi-frequency antenna system comprising:
   a resonant antenna including a first port, second port, third port, an inductor coil, a first capacitor in parallel to the inductor coil between the first port and the second port, and a second capacitor connected between the first port and the third port, wherein the first capacitor is in parallel to the inductor coil between the first port and the second port when the first port, the second port, and the third port are not connected with each other;
   an H-bridge circuit including first, second, and third half-bridge circuits connected
   between an input/output and ground, wherein a first half-bridge circuit is connected to the first port, the second half-bridge circuit is connected to the second port, and the third half-bridge circuit is connected to the third port; and a controller configured to control the H-bridge circuit;
   wherein the controller is configured to control the first half-bridge and the third half-bridge so that the first and third ports are connected together so that the resonant antenna has a first resonant frequency; and wherein the controller is configured to control the second half-bridge and the third halfbridge so that the second and third ports are connected together so that the resonant antenna has a second resonant frequency.

8. The circuit of claim 7, wherein the first half-bridge includes transistors T1 and T2, the second half-bridge includes transistors T3 and T4, and the third half-bridge include transistors T5 and T6, and wherein the controller includes a plurality of control circuits, wherein each of the plurality of control circuits is configured to control one of the transistors T1, T2, T3, T4, T5, and T6.

9. The circuit of claim 7, wherein,
   the first half-bridge includes transistors T1 and T2 and the third half-bridge include transistors T5 and T6, and
   the controller controls transistors T1 and T5 together and the controller controls transistors T2 and T6 together so that the resonant frequency of the resonant antenna is the first resonant frequency.

10. The circuit of claim 9, wherein the second capacitor is connected to a node between transistors T5 and T6.

11. The circuit of claim 10, wherein the first port is connected to a node between transistors T1 and T2.

12. The circuit of claim 7, wherein,
the second half-bridge includes transistors T3 and T4 and the third half-bridge include transistors T5 and T6, and
the controller controls transistors T3 and T5 together and the controller controls transistors T4 and T6 together so that the resonant frequency of the resonant antenna is the second resonant frequency.

13. The circuit of claim 12, wherein the second capacitor is connected to a node between transistors T5 and T6.

14. The circuit of claim 13, wherein the second port is connected to a node between transistors T3 and T4.

15. The circuit of claim 7, wherein
the resonant antenna includes a fourth port with a third capacitor connected between the first port and the fourth port,
the H-bridge circuit includes a fourth half-bridge circuit wherein the fourth half-bridge circuit is connected to the fourth port, and
the controller is configured to control the fourth half-bridge circuit to switch the connection of the second capacitance to the resonant antenna in combination with the first capacitance to allow for four different resonant frequencies for the resonant antenna.

16. A method of tuning a multi-frequency resonant antenna including an inductor coil, a first capacitor, and a second capacitor comprising:
providing a first control signal to a first half-bridge and a second half-bridge of a H-bridge circuit so that the first capacitor is in parallel with a coupling capacitor and both the first capacitor and the coupling capacitor are in series with an input/output of the multi-frequency resonant antenna resulting in a first resonant frequency; and
providing a second control signal to the second half-bridge and a third half-bridge of the H-bridge circuit so that the first capacitor is in parallel with the second capacitor resulting in a second resonant frequency.

\* \* \* \* \*